United States Patent [19]

Adams

[11] Patent Number: 4,514,750

[45] Date of Patent: Apr. 30, 1985

[54] INTEGRATED CIRCUIT PACKAGE HAVING INTERCONNECTED LEADS ADJACENT THE PACKAGE ENDS

[75] Inventor: Anthony L. Adams, McKinney, Tex.

[73] Assignee: Texas Instruments Incorporated, Dallas, Tex.

[21] Appl. No.: 338,754

[22] Filed: Jan. 11, 1982

[51] Int. Cl.³ .................... H01L 23/48; H01L 23/12
[52] U.S. Cl. ............................. 357/70; 174/52 FP
[58] Field of Search ............... 357/70; 29/827, 588; 174/52 FP

[56] References Cited

U.S. PATENT DOCUMENTS

| | | | |
|---|---|---|---|
| 3,617,819 | 11/1971 | Boisvert | 357/70 X |
| 3,714,370 | 1/1973 | Nixen et al. | 357/70 X |
| 4,012,768 | 3/1977 | Kirk et al. | 357/70 X |
| 4,141,712 | 2/1979 | Rogers | 357/70 X |

Primary Examiner—Andrew J. James
Assistant Examiner—S. V. Clark
Attorney, Agent, or Firm—Richard A. Bachand; N. Rhys Merrett; Melvin Sharp

[57] ABSTRACT

A package for an integrated circuit is provided with interconnected leads within accessible recesses in the enclosure of the package. The interconnections of the leads is severed to isolate each leads from all other leads.

2 Claims, 8 Drawing Figures

INTEGRATED CIRCUIT PACKAGE HAVING INTERCONNECTED LEADS ADJACENT THE PACKAGE ENDS

BACKGROUND OF THE INVENTION

1. Field of the Invention

This invention relates to packages for semiconductor devices, and more particularly, this invention relates to packages for integrated circuits which have leads connected together that are severed through recesses in the package after the formation of the package with the semiconductor device enclosed therein.

2. Description of the Prior Art

Various types of lead frames and the construction of packages for semiconductor devices, such as integrated circuits, are known in the prior art. An example of a package for an integrated circuit is shown in U.S. Pat. No. 3,781,457 by McKorreghan, issued on Dec. 25, 1973 and entitled "Glass Dual-In-Line Header". It is desirable for various reasons to hermetically seal the integrated circuit within the package. Therefore, the package should completely enclose the central area in which the integrated circuit is located. This prevents the movement of air and in particular moisture into the central area where the integrated circuit is located.

One type of lead frame is utilized in conjunction with ceramic packages for integrated circuits and in particular to those types of integrated circuit packages known as ceramic dual in line packages (C-DIP). This type of package provides a complete enclosure for the integrated circuit and allows the integrated circuit to be connected to each of the leads of the lead frame within the enclosure with one end of the lead located adjacent to the central area in which the integrated circuit is located. The other end of the lead extends out of the enclosure for contact with another electrical component, for example, a printed circuit board. It is, therefore, desirable that each of the leads be isolated from all the other leads both within the enclosure of the package and outside the enclosure of the package. The lead frames utilized with certain types of ceramic packages have a so-called flying lead. Each of the leads has an end disposed generally about a central portion of the lead frame which overlays the central area of the package when assembled. The exterior ends of the leads are connected to a common rail. Typically, the exterior portions of the leads are parallel on two opposite sides of the lead frame with two separate rails provided. The flying leads are attached at one end to one end of the rail and at another end to an end of the other opposite rail. The flying leads extend between the rails at an angle of approximately 90° to the rails. After the lead frame is formed into an appropriate shape for utilization within the enclosure of the package, the flying leads are of the same general shape, as the other leads and still interconnect the rails of the lead frame.

The external portions of the frame are formed and bent to approximately an 80° angle with respect to the portion of the lead frame which is located within the enclosure of the package. The bends in the leads are approximately parallel to the rails. The package is then assembled, as is discussed herebelow in conjunction with the detailed description of the present invention. A contact pad on the integrated circuit is connected to a contact pad located adjacent to the end of each of the leads. The package is then hermetically sealed with the integrated circuit connected to each of the leads within a central area. The rails are then severed from the ends of the leads outside the package, which as a result, severs the flying leads from the assembled package. Only the leads which connect to the integrated circuit within the package remain.

Thus, the circuit from a contact pad on the integrated circuit through a wire loop extending from that contact pad to the associated contact pad of the lead frame and the connection through the enclosure of the package to the end of the lead outside the package is isolated from all the other leads. This provides a complete electrical circuit for connecting the contact pads of the integrated circuit to another electrical component, for example, a printed circuit board. It has, after formation of the hermetically sealed device, been found useful to plate the exterior portions of the leads with tin. During plating, it has been found useful to have the flying rails attached between the end rails of the lead frame. Thus, the plating step takes place between the hermetic sealing of the integrated circuit within the enclosure of the package and the severing of the rails from the leads. The flying rails constitute approximately 25% of the metal and weight on the lead frame and also greatly widen the lead frame. If the flying rails can be eliminated, more lead frames can be formed from the same amount of metal with the weight of each individual lead frame being reduced. Further, after the packages are formed, the flying rails can, in automatic devices, overlap and lock with the flying rails on other adjacent packages which can jam and reduce the efficiency of automated handling equipment.

None of the prior construction shows a package having recesses located in the enclosing structure about the integrated circuit which allows the severing of connected leads after hermetically sealing the chip carrier.

SUMMARY OF THE INVENTION

The invention includes an enclosure which is provided with recesses into interconnections between leads of the lead frame. A typical lead frame for a dual in-line package (DIP) has a plurality of leads with one end close to a central area of the package wherein a semiconductor device is located, for example, an integrated circuit. The leads then extend away from the central area to another end outside the enclosure of the package. Typically, the leads are divided into two sets of equal numbers of leads which exit from the enclosure of the package through opposite sides. The dual in-line packages have a rectangular top and bottom and the leads exit from the longer side. The sides extend from the top of the package enclosure to the bottom thereof. The leads outside the enclosure are generally parallel along their lengths; however, they are arranged within the enclosure to allow the ends of the leads within the package to be brought into close proximity to the central area wherein the semiconductor device is located.

Each end of a lead, which is located adjacent to the central area, has a contact pad associated therewith. The contact pad of the lead is connected through a thin wire which is attached by, for example, ball bonding techniques, to a contact pad on the semiconductor device to form an electrical connection therewith.

Each set of leads has a rail attached to the ends of the leads outside the package. This rail provides physical support during the attachment of the leads to the semiconductor device and the formation of the enclosure of the package. Each set of leads has two outer leads and a number of inner leads. The outer leads are the leads which have only one lead adjacent thereto. In other words, if the exiting of the leads is viewed as sequential along the side of the enclosure, then an outer lead is the first lead in the sequence and the other outer lead is the last lead in the sequence. The outer leads at one end of the package are connected together as are the outer leads at the other end of the package. Each of the inner leads has either an outer lead and another inner lead adjacent thereto, or two inner leads adjacent thereto in the sequence. The connection of the outer leads is within a recess in the enclosure of the package.

After the semiconductor device is hermetically sealed into the enclosure of the package and the outer leads are plated by electro-plating tin onto the material of the lead frame which can be, for example, "alloy 42", the interconnection between the outer leads is severed. This leaves each lead isolated from all the other leads of the lead frame. The end rails of the lead frame are then severed from the leads and this results in the final formation of the dual in-line package.

It is an advantage of the present invention to provide a lower cost lead frame for a dual in-line package.

It is a further advantage of the present invention to provide a lead frame which is lighter in weight for a dual in-line package.

An additional advantage of the present invention is to provide a lead frame for a dual in-line package which does not have a flying rail associated therewith prior to severing the end rails from the leads of the lead frame.

It is a further advantage of the present invention to provide a dual in-line package which does not have a flying lead extending therefrom which can contact and interlock with the flying leads of other chip carriers prior to the severing of the end rails which results in the severing of the flying leads from the finally assembled dual in-line package.

DESCRIPTION OF THE PREFERRED EMBODIMENT

Figure 1:
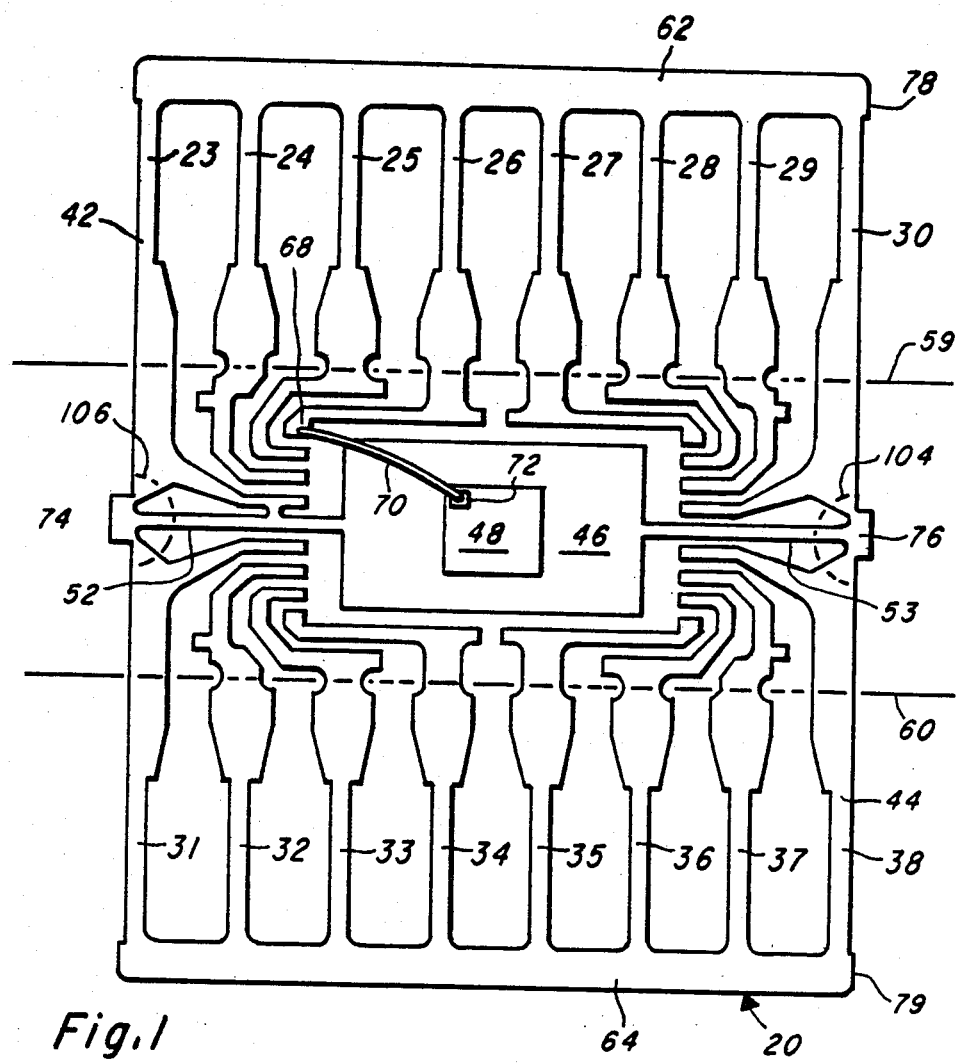
FIG. 1 is a top view of a lead frame constructed according to the present invention.

With reference to the drawings and in particular with reference to FIG. 1 thereof, a lead frame 20 is shown. Lead frame 20 has a plurality of leads 23-38. The leads are divided into two sets of leads 42 and 44, which are comprised of leads 23-30 and leads 31-38, respectively. The lead frame 20 is also provided with a bar pad 46 for positioning a semiconductor device 48 thereon. As will be shown in FIGS. 2 through FIG. 7, the package is partially assembled prior to placement of the semiconductor device 48 on the bar pad 46. It is shown positioned in FIG. 1 for ease of understanding of the interconnections between the leads 23-38 and the semiconductor device 48.

Figure 6:
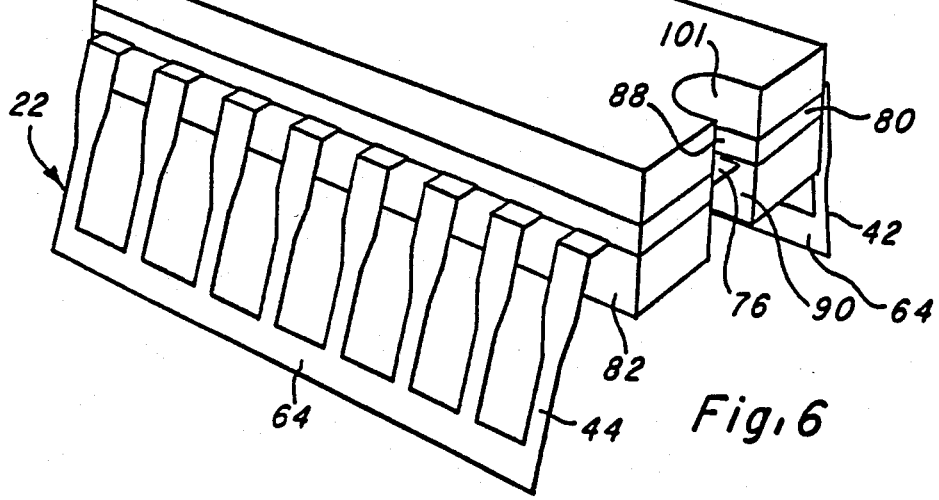

The bar pad 46 is shown as having a rectangular shape with two elongated supports 52 and 53 extending from the center of the shorter sides of the rectangular shape of bar pad 46. The enclosure 56 (FIG. 6) encloses the portion of the leads 23-38 between the dotted lines 59 and 60 of FIG. 1. The portion of the leads 23-30 of set 42 which extend beyond the enclosure represented by dotted line 59 in FIG. 1 are generally parallel extending outward from the longer side of the generally rectangular enclosure 56 (FIG. 6). The ends of the leads 23-30 outside the enclosure 56 terminate at and are connected to a support rail 62 which extends from lead 23 to lead 30 and has the leads 24-29 affixed in sequence thereto. Leads 23 and 30 form a pair of outer leads with a plurality of inner leads being formed by leads 24-29 therebetween. Leads 31-38 have their ends outside of enclosure 56 as represented by dotted line 60 in FIG. 1 terminated at and attached to a support rail 64. Leads 31 and 38 are outer leads with inner leads 32-37 extending in a sequence from lead 31 to lead 38. The leads 31-38 of set 44 are generally parallel as they extend from enclosure 56 (FIG. 6) as represented by line 60 in FIG. 1. In forming the lead frame prior to the commencment of packaging of the semiconductor device 48, the lead frames are bent generally along lines 59 and 60 (and rotated toward each other) until the outer portions of leads are at an angle of approximately 80° with respect to the portion of the leads between lines 59 and 60. The lead frame 20, with its various leads and bar pads, is formed as a single plane of thin, flat material, by any standard technique, for example, photolithographic processes.

During the formation of the dual in-line package 66 (FIG. 7), semiconductor device 48 is affixed to bar pad 46. Each of the leads 23-38 is provided with a contact pad adjacent to the central area which has the bar pad 46 located therein. Only contact pad 68 of lead 26 is discussed in detail. All of the other contact pads are similar in nature and a detailed discussion of contact pad 68 shall suffice for all. A wire loop 70 is connected by some standard technique, for example, ball bonding, ultrasonic bonding, thermal compression bonding, etc., at one end to contact pad 68 of lead 26 and at its other opposite end to a contact pad 72 on semiconductor device 48. Each of the contact pads of the other lead frames 23-25 and 27-38 can also be connected individually to a contact pad (only contact pad 72 is shown) on semiconductor device 48. The connection between semiconductor device 48 and the contact pads of the leads 23-38 can be by any standard technique, including that known as tape automated bonding.

Support 52 extends away from bar pad 46 and is connected at its other opposite end to a nib 74. Support 52 can be connected to lead 42 for grounding the bar pad 46, if desired. The bar pad 46 and supports 52 and 53 can be eliminated if it is desired to directly mount the semiconductor device 48 to another structure in the dual in-line package, for example, sheet 82. Nib 74 is also connected to outer leads 23 and 31. Support 53 extends outward from bar pad 46 and is connected to a nib 76 similar to nib 74. Nib 76 is also connected to outer leads 30 and 38. Nibs 74 and 76, along with the leads 23-38 and rails 62 and 64, provide support for the lead frame 20 and maintain its various parts in their proper relative positions when the leads 23-38 are bent at an appropriate angle as discussed above. Further, through the interconnection between outer leads 23 and 31, and 30 and 38, plating of the outer portion of the leads beyond the dotted lines 59 and 60 toward rails 64 and 62 is facilitated. The lead frame is generally constructed from alloy 42 or KOVAR ( a trademark of Carborundum Company) and it is desirable to plate a material such as tin thereon after formation of the enclosure 56 (FIG. 6).

In the prior art as discussed above, a flying lead (not shown) would extend from the end 78 of rail 62 to the end 79 of rail 64. Outer leads 30 and 38 would not be interconnected. Support 53 can extend from bar pad 46 to the flying lead without connection to the leads 30 and 38. The flying leads in that event provide the necessary physical support to the lead frame during formation of an assembly of the dual in-line package. As stated above, the flying leads constitute a significant quantity of material which is discarded prior to production of the final dual in-line package and becomes scrap.

Figure 2:
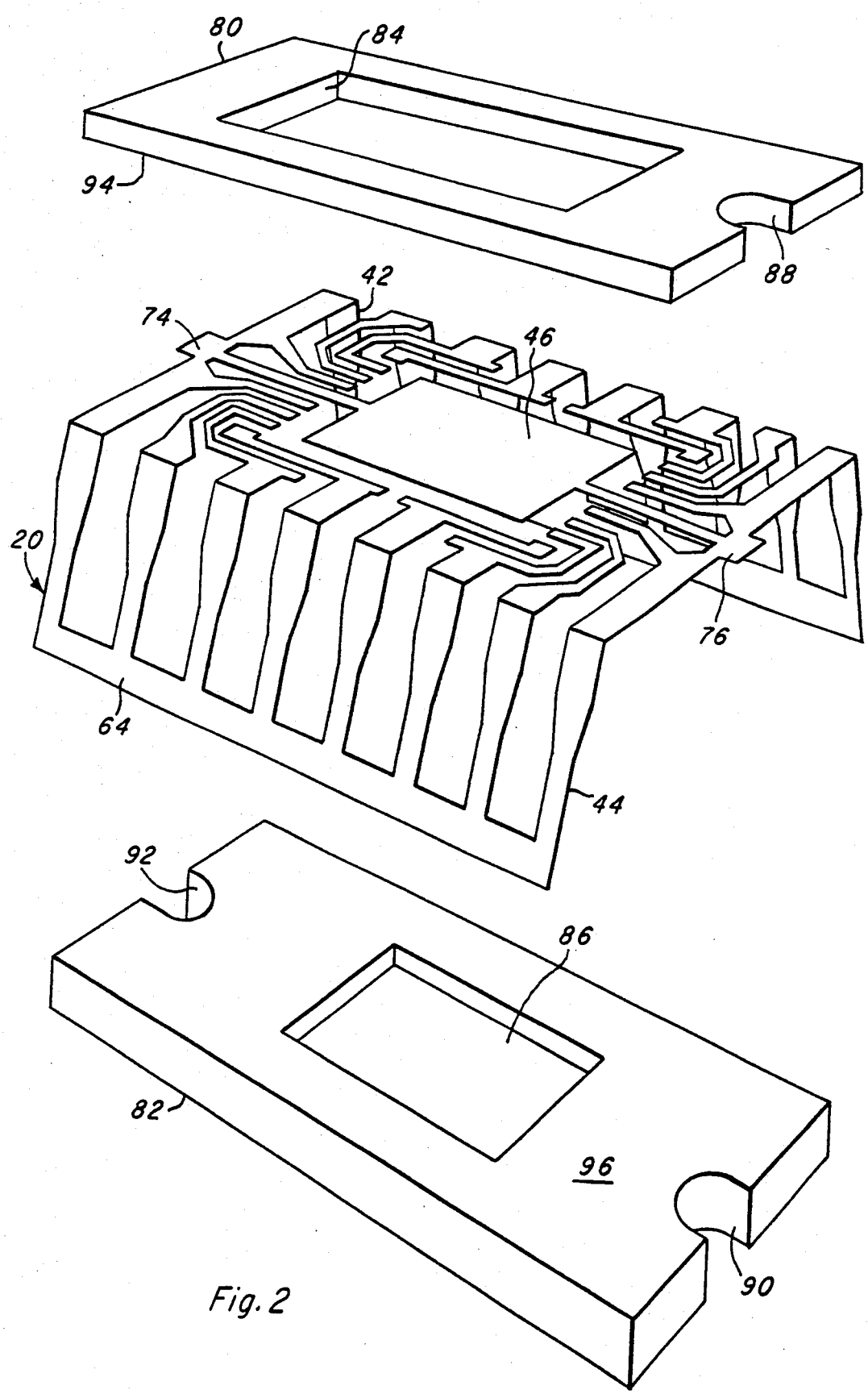
Figure 7:
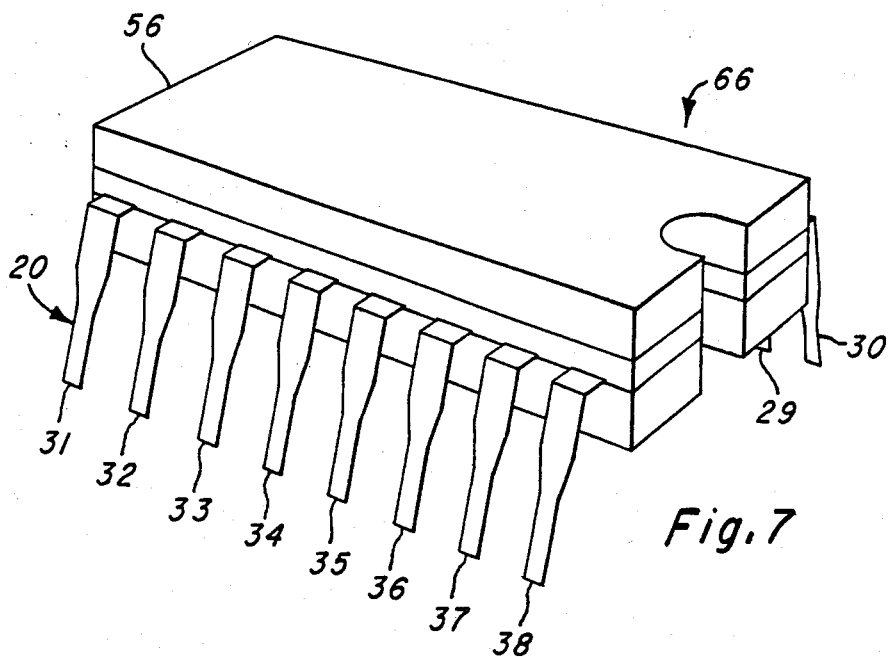

FIGS. 2-6 show a process of assembly of a dual in-line package and specifically the generation of an enclosure 56 followed by the generation of the completed dual in-line package 66 (FIG. 7). In FIG. 2, the lead frame 20 is shown with the sets of leads 42 and 44 bent at close to right angles to the plane formed by the portion of the leads which will shortly be within enclosure 56 and specifically that portion of the leads close to the bar pad 46. This is the area of the lead frame between dotted lines 59 and 60. The FIG. 2 is an exploded view and shows a top sheet 80 positioned above lead frame 20 and a bottom sheet 82 which is generally coextensive with the rectangular shape of top sheet 80 positioned below. The material of sheets 80 and 82 can be, for example, a ceramic material with the flat surfaces 94 and 96, respectively, which will contact lead frame 20, coated with a material which can be heated to flow into contact with the lead frame 20 and with the spaces between the leads to form a hermetic seal between the top and bottom sheets 80 and 82 with the lead frame 20 sandwiched between. Top sheet 80 is provided with an opening 84 which can be of any convenient shape and which is sufficiently large to expose all of the ends of the leads 23–38 (FIG. 1) adjacent to bar pad 46 and the bar pad itself. The bottom sheet 82 has a shallow indentation 86 which is adapted to receive the bar pad 46 therein. As the bar pad 46 is slightly lower than the ends of the leads 23–38 (FIG. 1), the contact pads of the integrated circuit and the contact pads of the leads can have approximately the same altitude. Bar pad 46 can, at some time during the formation prior to or in conjunction with the affixation of the semiconductor device 48 to the bar pad, be slightly depressed into the shallow indentation 86. Top sheet 80 has a recess 88 in one of its shorter ends which has a generally semi-circular shape, although any appropriate shape can be utilized. In practicing the present invention, the recess 88 can be eliminated if desired, although recess 88 along with the recess 90 in bottom 82 provide the necessary conventional indexing for the pins of the dual in-line package 66.

Bottom sheet 82 has, along with recess 90 in one of its short sides, another recess 92 in the other opposite short side. Recesses 90 and 92 have a generally semi-circular shape, although once again, any appropriate shape can be utilized. Top sheet 80 is provided with a generally flat surface 94 and sheet 82 is provided with a generally flat surface 96. The flat surfaces 94 and 96 contact the lead frame 20 and after being fused together form a hermetic seal therewith.

Figure 3:
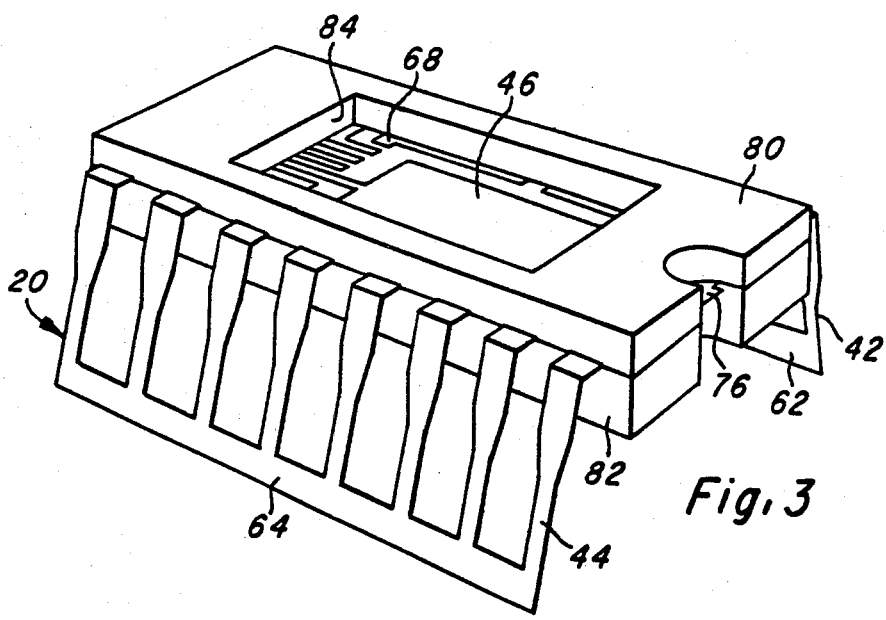
FIGS. 2 through 7 show various stages in the assembly of a dual in-line package according to the present invention.

As shown in FIG. 3, sheets 80 and 82 are sealed together with the lead frame 20 sandwiched therebetween. The outer portions of the sets of leads 42 and 44 are shown extending outward and then generally downward, as shown in FIG. 3, terminating in rails 62 and 64.

Bar pad 46 is also shown within the opening 84 in sheet 80 with the contact pads at the ends of the leads 23–38 shown including contact pad 68.

Figure 4:
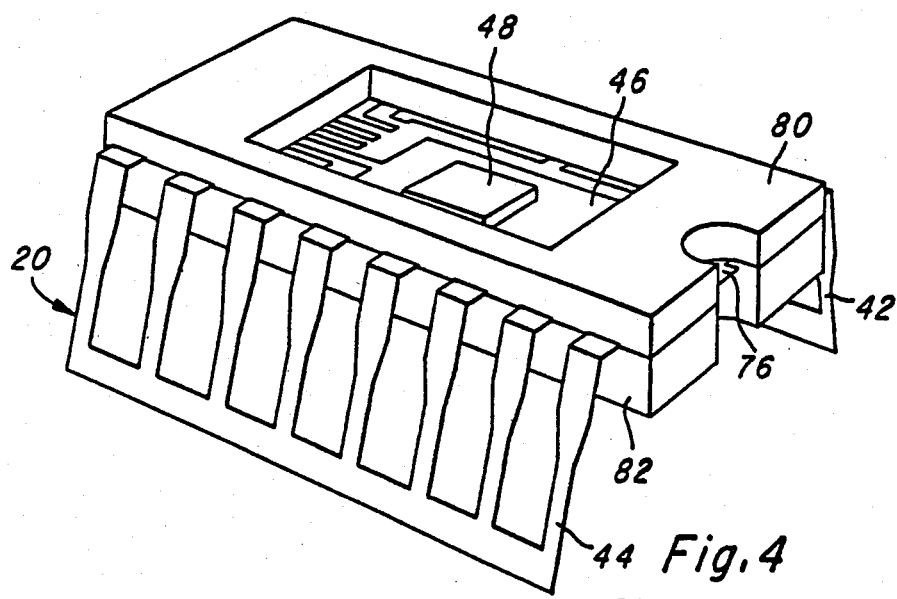
Figure 5:
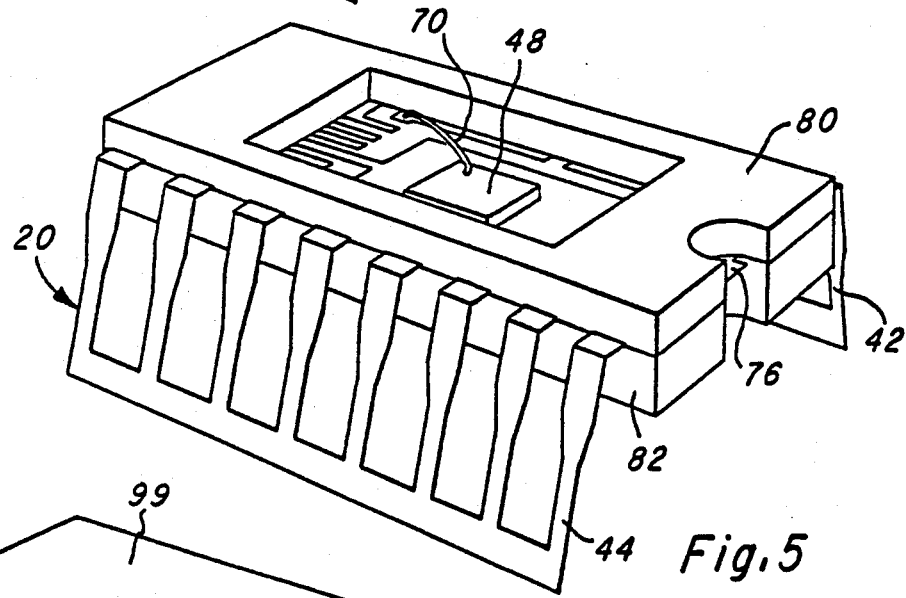

In FIG. 4, a semiconductor device 48 has been affixed onto bar pad 46. In FIG. 5, the semiconductor device 48 is shown as connected to each of the contact pads of the leads by, for example, a wire loop (only wire loop 70 of FIG. 1 is shown in detail herein). Because of the relative size of the components, the semiconductor device 48 was shown in FIGS. 1 and 5 with its connection with one of the bar pads for clarity of explanation, although the semiconductor device 48 will typically not be connected to the lead frame until the lead frame and sheets 80 and 82 were joined together as shown in FIG. 3.

In FIG. 6, another flat sheet 99 is attached and sealed to sheet 80. Sheet 99 can be of a material similar to the material of sheet 80. As shown in FIG. 6, the sheet 99 is coextensive with sheet 80. However, it is only necessary that sheet 99 cover the opening 84 for completely sealing the semiconductor device 48 within a central area of the package to form an enclosure 56. Enclosure 56 comprises the sheets 80, 82, and 99. The lead frame with its leads 23-38 (FIG. 1) extends outward through the long sides of the rectangular shaped enclosure 56. Specifically, the sets of leads 42 and 44 of lead frame 20 extend out from the longer sides of enclosure 56 and then downward to terminate at rail 62 and 64. Nib 76 is shown in FIG. 6 within recesses 88 and 90. Continuing the indexing of the pins of the dual in-line package, a recess 101 is provided in sheet 99. The portions of the lead frame 20 exposed within recesses 90 and 92 (FIG. 2) in sheet 82 are shown in FIG. 1 by the semi-circular dotted lines 104 and 106, respectively. Thus, the entire area of interconnection between the support 53, nib 76, and outer leads 30 and 38, are disposed within the recess 90 as shown by dotted line 104. The entire area of interconnection between outer leads 23 and 31, support 52 and nib 74, are shown by dotted line 106 as exposed within the recess 92. Thus, nib 74 and its connection to leads 23 and 31 and support 52 are exposed within recess 92. If the material adjacent the nib 74 and nib 74 itself are severed from the remainder of the lead frame 20, the leads 23 and 31 and support 52 are completely disconnected from each other.

Thus, if the material adjacent nib 74 is severed from lead frame 20, support 52 is isolated from leads 23 and 31, and leads 23 and 31 are isolated from each other. Further, if the nib 76 and the adjacent portions of leads 30 and 38 and support 53 are severed from the remainder of lead frame 20, lead 30 is disconnected from any contact with support 53 and lead 38. Further, lead 38 is disconnected from support 53.

The enclosure 56 and lead frame 20 as shown in FIG. 6 would be passed through a plating process for plating material onto the portion of the leads of lead frame 20 extending from enclosure 56. The rails 62 and 64 can then be removed prior to severing the material of lead frame 20 within recesses 90 and 92 can be removed from the leads. Conversely, the material of lead frame 20 within recesses 90 and 92 can be removed prior to the severing of the rails 62 and 64 from the lead frame 20.

Figure 8:
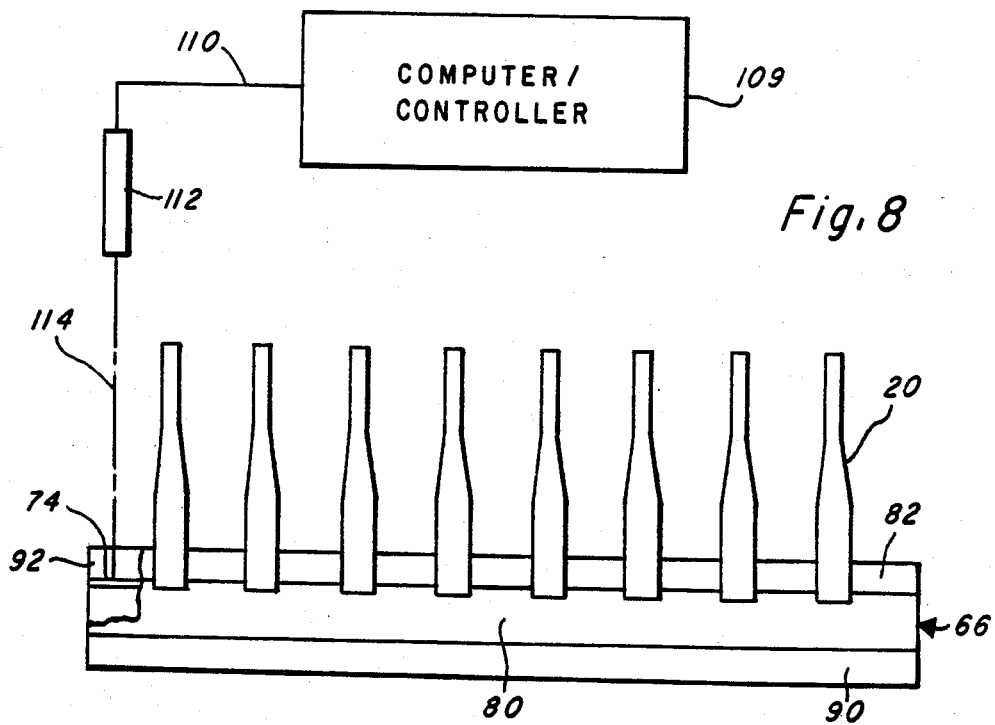
FIG. 8 is a schematic diagram of a device for severing the connected leads of the chip carrier within recesses in the enclosure thereof.

As shown in FIG. 8, a computer and/or controller 109 produces a signal through line 110 to actuate a laser 112. The laser projects an intense light beam 114 into recess 92. Nib 74 and the material adjacent thereto is severed by the intense heat produced by light beam 114 from the remainder of lead frame 20. Thus, leads 32 and 31 are disconnected from each other and from support 52. Although a laser is shown as severing the material of the lead frame herein, the severing can be performed by any appropriate technique.

The final dual in-line package 66 is shown in FIG. 7. The enclosure 56 has a hermetically sealed semiconductor device 48 (FIG. 1) in a central area therein. The central area being generally defined by the indentation 86, opening 84 in sheet 80 and the bottom surface (not shown) of sheet 99 sealed to sheet 80. The leads 23–38 now provide individual conductive paths from their connections, for example, to a socket or printed socket board into enclosure 56 and through the wire loops (only loop 70 is shown in FIG. 1) to the individual contact pads of the semiconductor device 48 (only contact 72 of semiconductor device 48 is shown in FIG. 1). Thus, a completely assembled dual in-line package 66 has been generated without utilization of the flying lead to maintain support structure. The support structure of lead frame 20 provided by the nibs 74 and 76, the material of supports 52 and 53, and leads 23, 30, 31 and 38. Nibs 74 and 75 have been severed from the remainder of lead frame 20. Leads 23 and 31 have been disconnected from each other and support 52, and leads 30 and 38 have been disconnected from each other and support 53.

The method of package assembly as described herein does not have a protruding flying lead which can entangle with the flying leads of other packages. Also, the interconnected leads and the end rails provide conductive path to ensure proper plating. Only one pair of interconnected leads can be utilized. Sheet 99 and the opening 84 in sheet 80 can be omitted if the semiconductor 48 is bonded to frame 20 prior to the attachment of sheet 80 to sheet 82.

Having described the invention in connection with certain specific embodiments thereof, it is now to be understood that further modifications may now suggest themselves to those skilled in the art and it is intended to cover such modifications as fall within the scope of the appended claims.

What is claimed is:

1. A package for containing an integrated circuit device, comprising:
  an enclosure having a central cavity for receiving the integrated circuit device, said enclosure having a pair of opposite ends having recesses and a pair of opposite sides; and
  a leadframe having a central bar pad for carrying said integrated circuit device and a plurality of leads having first and second ends,
  the bond pad and the first ends of the leads being located within the cavity of said enclosure,
  the second ends of the leads being located outside of said enclosure, forming first and second lead sets of parallel leads projecting from opposite sides of said enclosure,
  the leads of said leadframe having leads closest to said ends of said enclosure which are interconnected within the recesses of the ends of said enclosure.

2. The package of claim 1, wherein the second ends of the first lead set are connected together, and the second ends of the second lead set are connected together.

* * * * *